United States Patent
Root et al.

(10) Patent No.: US 6,783,298 B2
(45) Date of Patent: Aug. 31, 2004

(54) DEVICE FOR CONNECTING A CONTROL MECHANISM TO AN END OF A SUPPORT ARM SYSTEM

(75) Inventors: Paul Root, Bad Endbach (DE); Markus Neuhof, Ehringshausen-Niederlemp (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 10/231,372

(22) Filed: Aug. 29, 2002

(65) Prior Publication Data

US 2003/0068196 A1 Apr. 10, 2003

(30) Foreign Application Priority Data

Aug. 29, 2001 (DE) .......................................... 101 42 233

(51) Int. Cl.[7] .................................................. F16B 1/00
(52) U.S. Cl. ................... 403/315; 248/222.41; 403/353
(58) Field of Search ................................. 403/348, 349, 403/353, 315–317, 331; 248/222.41, 221.12, 343, 223.21

(56) References Cited

U.S. PATENT DOCUMENTS

| | | | | |
|---|---|---|---|---|
| 1,483,252 A | * | 2/1924 | Symmes ...................... | 248/343 |
| 1,784,204 A | * | 12/1930 | Roedding .............. | 248/222.41 |
| 2,095,653 A | * | 10/1937 | Tepel .......................... | 248/343 |
| 2,448,001 A | * | 8/1948 | Maurette ...................... | 248/343 |
| 2,507,308 A | * | 5/1950 | Kruger ........................ | 248/343 |
| 2,628,050 A | * | 2/1953 | Hardwick ............... | 248/222.41 |
| 3,676,570 A | * | 7/1972 | Gabb .......................... | 174/61 |
| 5,024,409 A | * | 6/1991 | Bohnen ................. | 248/222.41 |
| 5,533,763 A | * | 7/1996 | Neuhof .................... | 285/179.1 |
| 6,095,467 A | * | 8/2000 | Neuhof .................... | 248/278.1 |

FOREIGN PATENT DOCUMENTS

DE 298 06 875 U1 7/1998

\* cited by examiner

Primary Examiner—James R. Brittain
(74) Attorney, Agent, or Firm—Pauley Petersen & Erickson

(57) ABSTRACT

A device for connecting a control mechanism to an end of a support arm system with mounting screws that have screwheads projecting from the control mechanism and that can be inserted vertically and up into keyhole type screw receptacles of the support arm system. The mounting screws can be temporarily held in the holding slots of the screw receptacles by horizontal displacement and fixed in the holding position by rotation. According to this invention, if a vertical lowering of the mounting screws and insertion of the screwheads into securing receptacles at the end of the holding slots of the screw receptacles are performed after horizontal displacement of the mounting screws, which prevents horizontal displacement of the mounting screws from the holding position, then the set holding position is secured so that unintentional release of the control mechanism from the support arm system is reliably prevented.

11 Claims, 3 Drawing Sheets

DEVICE FOR CONNECTING A CONTROL MECHANISM TO AN END OF A SUPPORT ARM SYSTEM

BACKGROUND OF THE INVENTION

1. Field of the Invention

This invention relates to a device for connecting a control mechanism to an end of a support arm system using mounting screws that have screwheads projecting from the control mechanism and that can be inserted up, vertically into keyhole type screw receptacles of the support arm system, and the mounting screws can be held temporarily in the holding slots of the screw receptacles through horizontal displacement and fixed in the holding position by rotation.

2. Discussion of Related Art

A device using a known hanging device with keyhole receptacle and mounting screws with screwheads for temporary connection of a control mechanism to the support arm system and is shown in German Patent Reference DE 298 06 875 U1. This known device allows a connection to be accomplished by one person. However, after the hanging and the shifting of the control mechanism, there is still a risk that if the control mechanism becomes loose before the mounting screws are fixed, the temporary holding position can be released again by itself. There is a greater risk because it is not assured that the set holding position is also maintained. For unfavorable positioning, the control mechanism can shift out of the holding position and the insertion holes of the keyhole receptacles can release the mounting screws, so that the control mechanism automatically releases from the support arm system.

SUMMARY OF THE INVENTION

One object of this invention is to provide a device of the type mentioned above but so that the set holding position of the control mechanism is held reliably on the support arm system and cannot be released by itself.

This object is achieved according to this invention with a vertical lowering of the mounting screws and insertion of the screwheads into securing receptacles at the end of the holding slots of the screw receptacles being performed after the horizontal displacement of the mounting screws, which prevents a horizontal displacement of the mounting screws from the holding position.

After the horizontal displacement of the mounting screws and the release of the control mechanism, the screwheads of the mounting screws are led into the securing receptacles so that the holding position is secured and the control mechanism cannot release itself from the support arm system. Here, the mounting screws are led into these securing positions due to the weight of the control mechanism and are held securely in these positions by the weight of the control mechanism. After producing the temporary holding positions, the person performing the assembly can release the control mechanism without concern and focus attention on fixing the mounting screws for producing the final connection between control mechanism and support arm system.

Here, the securing receptacles are mounted from the side facing the support arm system, so that the holding position is automatically secured.

According to one advantageous configuration, the mounting screws are attached to a connection frame that can be connected to the control mechanism and that surrounds the insertion opening of the control mechanism. This connection frame is attached to the inner side of the cover wall of the control mechanism. The screwheads of the mounting screws project from the outer side of the cover wall and the screw receptacles are formed in a connection plate, which is connected to the end of the support arm system. The connection can be adapted to in a simple way and can be attached to the control mechanism and the support arm system. Thus, the connection frame with the mounting screws can be adapted to the number and distribution of fastening receptacles in the connection plate.

A unique connection can be achieved when the connection plate is configured like a hood and has a rectangular connection plane for the control mechanism, which has four screw receptacles in the corner regions oriented in the same direction, which also exhibits resistance to twist.

In another embodiment, the connection plate is connected by a swivel joint to the end of a support arm of the support arm system, and the support arm is formed as a hollow profile section and the swivel joint and also the connection plate have a cable duct, and thus the angle position of the control mechanism can be changed on the carrier arm system.

This invention is also adjustable in a similarly advantageous way when the screw receptacles are arranged on the control mechanism and the mounting screws on the support arm system.

BRIEF DESCRIPTION OF THE DRAWINGS

This invention is explained in more detail in view of an embodiment shown in the drawings, wherein.

DESCRIPTION OF PREFERRED EMBODIMENTS

Figure 1:
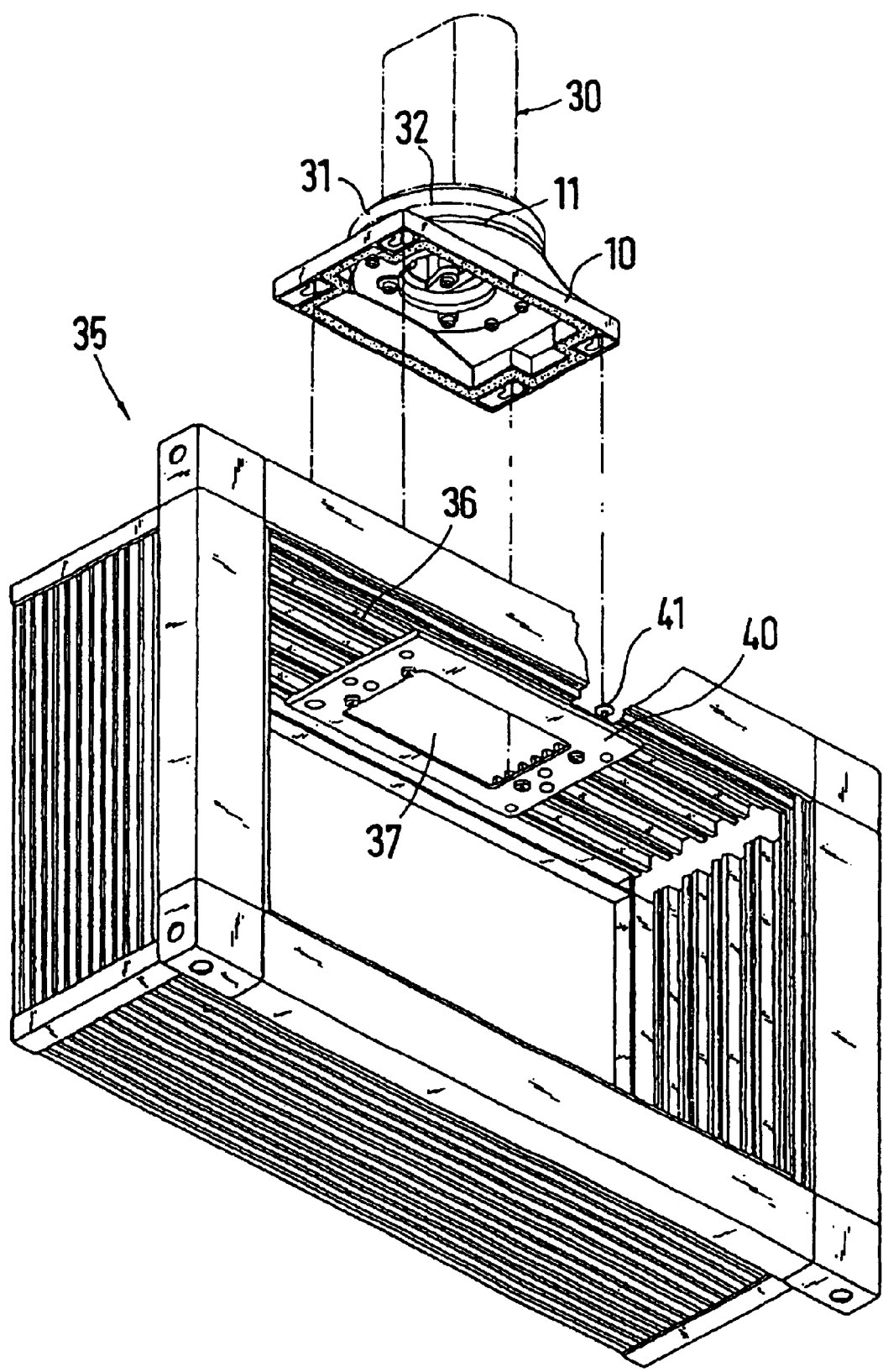
FIG. 1 is a perspective exploded view of a control mechanism housing that can be attached to the end of a support arm system.
Figure 2:
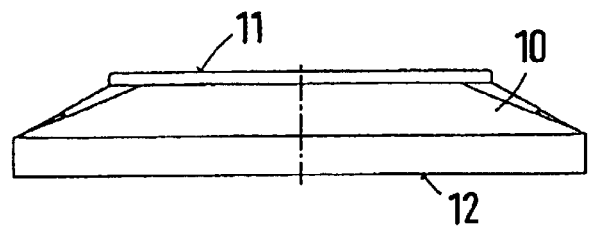
FIG. 2 is a side view the connection plate used for the attachment.

As FIG. 1 shows, a support arm system configured as a hollow profiled section is closed on the end of a support arm 30 with a swivel joint made up of the joint parts 31 and 32. In this way, a hood-like connection plate 10 is attached to the joint part 32 on the connection side 11. The control mechanism 35 to be attached has an insertion opening 37 for connection cables and attachment cables in the cover wall 36. On the inside of the cover wall 36 a connection frame 40 surrounding the insertion opening 37 is attached. This frame supports mounting screws 41, which are guided through the cover wall 36 with their screwheads projecting from the outer side.

FIGS. 2–5 show a constructive configuration for the connection plate 10, wherein the connection side 11 contacts the swivel joint and the connection side 12 is connected to the connection frame 40 of the control mechanism 35. The connection side 11 is round and surrounds a cable insertion opening 13. The screw receptacles 14 receive connection screws that connect the connection plate 10 to the joint part 32.

Figure 3:
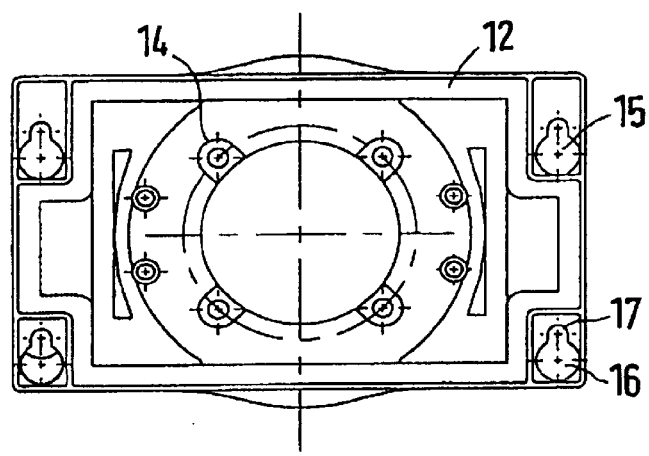
FIG. 3 is a bottom view of the connection plate facing the control mechanism.
Figure 4:
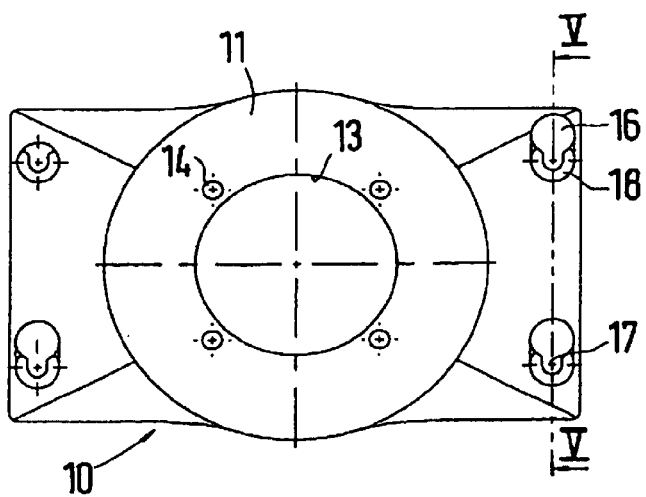
FIG. 4 is a top view of the connection plate facing the support arm system.
Figure 5:
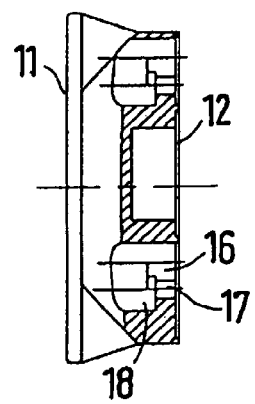
FIG. 5 is a partial section taken through the connection plate, along line V—V as shown in FIG. 4.

The connection side 12 is rectangular and in the corners has four keyhole-like screw receptacles 15 that are made of an insertion hole 16 and an adjacent holding slot 17, as shown in FIG. 3. A recessed securing receptacle 18 is formed from the connection side 11 outwards for the screwhead 42 of the mounting screws 41 on the end of the holding slot 17. All screw receptacles 15 are oriented the same and configured the same.

Figure 6:
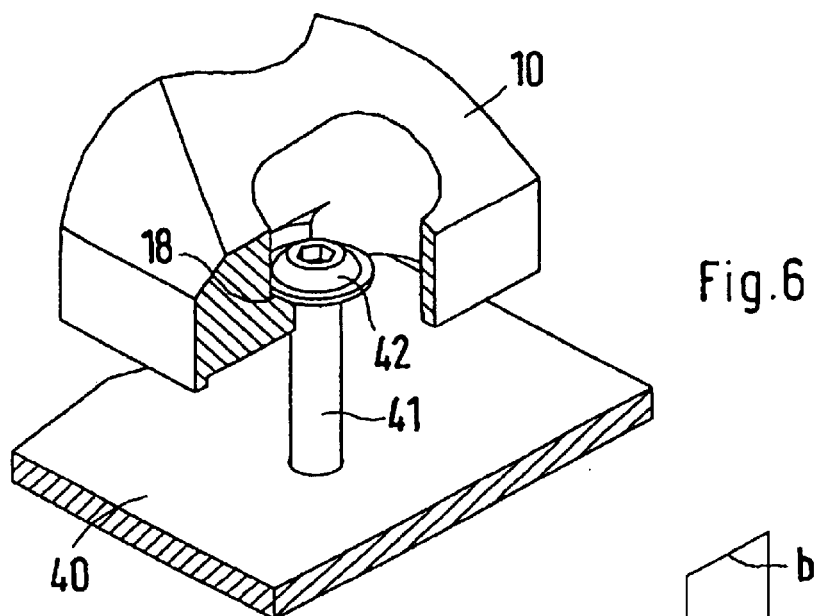
FIG. 6 is an enlarged partial perspective view of a secured holding position between mounting screw and screw receptacle.
Figure 7:
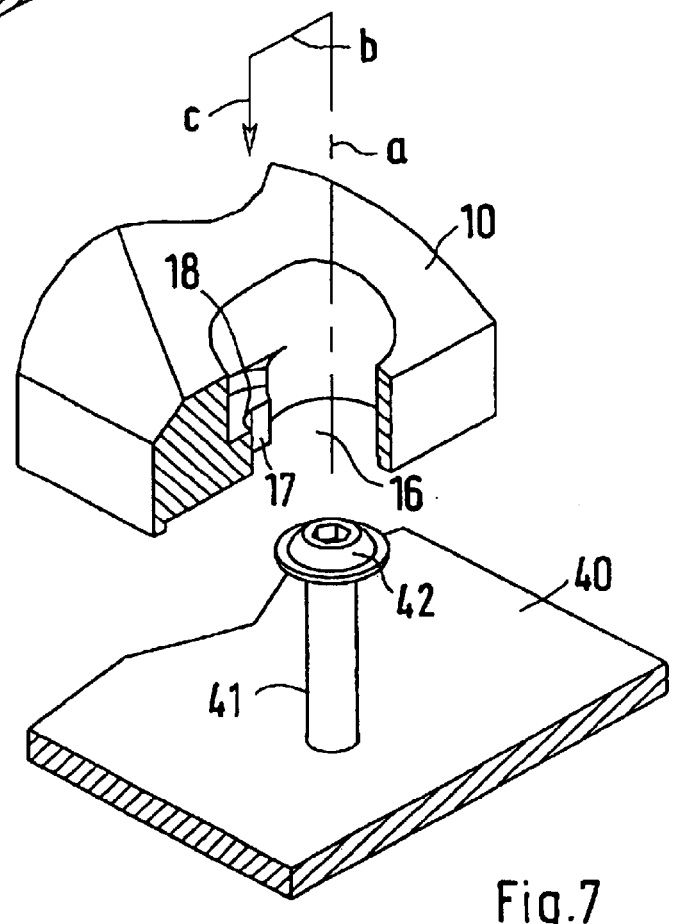
FIG. 7 is a partial perspective view showing the sequence for the production of the secured holding position.

As FIG. 7 shows, on a connection point, the mounting screw 41 is inserted from below with the screwhead 42 vertically up into the screw receptacle 15. In this way, during the insertion motion a the screwhead 42 is guided into the insertion hole 16. The insertion motion a can be limited by a stop. Then a horizontal displacement motion b is performed, wherein the mounting screw 41 is led into the holding slot 17 and the screwhead 42 is set on the side of the screw receptacle 15 facing the support arm system. If the mounting screw 41 strikes the end of the holding slot 17, then a temporary holding position is reached and the control mechanism 35 can be released. The screwhead 42 is guided by the present lowering of the control mechanism 35, motion c, into a securing receptacle 18, which is adapted in cross section to the cross section of the screwhead 42, as FIG. 6 shows. Thus, the holding position is secured, so that the mounting screws 41 can no longer be pushed back horizontally and cannot be unintentionally released from the screw receptacle 15.

The assembly work for a single person is thus significantly simplified, because after hanging the control mechanism 35 on the connection plate 10, the control mechanism 35 can be released without risk of the connection plate 10 loosening. The person can then complete the task without regard to the fixing of the mounting screws 41.

The number and distribution of screw receptacles 15 and the mounting screws 41 can also be selected differently, they need only match, where the screw receptacles 15 must always be oriented in the same way.

The screw receptacles 15 and the mounting screws 41 can also be exchanged on the connection plate 10 and the connection frame 40.

German Patent Reference 101 42 233.4-34, the priority document corresponding to this invention, and its teachings are incorporated, by reference, into this specification.

What is claimed is:

1. In a device for connecting a control mechanism to an end of a support arm system using mounting screws having screwheads projecting from the control mechanism and that are insertable into keyhole screw receptacles of the support arm system, the mounting screws being held temporarily in the holding slots of the screw receptacles by horizontal displacement and fixed in a holding position by rotation, the improvement comprising: a vertical lowering of the mounting screws (41) and insertion of the screwheads (42) into securing receptacles (18) at the end of the holding slots (17) of the screw receptacles (15) performed after a horizontal displacement of the mounting screws (41) to prevent the mounting screws (41) from horizontally displacing from the holding position, and the mounting screws (41) attached to a connection frame (40) which is connectible to the control mechanism (35), that surrounds an insertion opening (37) of the control mechanism (35), and that is fixed to an inner side of a cover wall (36) of the control mechanism (35), and the mounting screws (41) having the screwheads (42) projecting to the outer side of the cover wall (36).

2. In the device according to claim 1, wherein the securing receptacles (18) are attached from a side facing the support arm system.

3. In the device according to claim 1, wherein the screw receptacles (15) are attached in a connection plate (10) which is connected to an end of the support arm system.

4. In the device according to claim 3, wherein the connection plate (10) is configured as a hood and has a rectangular connection plate (12) for the control mechanism (35), which in corner regions has four of the screw receptacles (15) oriented in the same direction.

5. In the device according to claim 4, wherein the connection frame (40) with the mounting screws (41) is adapted to a number and a distribution of the screw receptacles (15) in the connection plate (10).

6. In the device according to claim 5, wherein the connection plate (10) is connected by a swivel joint (31, 32) to the end of a support arm (30) of the support arm system, the support arm (30) is a hollow profiled section, and the swivel joint (31, 32) and the connection plate (10) have a cable duct (13).

7. In the device according to claim 6, wherein the screw receptacles (15) are formed in the connection plate (12) and the mounting screws (41) are supported by the connection frame (10).

8. In the device according to claim 3, wherein the connection plate (10) is connected by a swivel joint (31, 32) to the end of a support arm (30) of the support arm system, the support arm (30) is a hollow profiled section, and a swivel joint (31, 32) and the connection plate (10) have a cable duct (13).

9. In a device for connecting a control mechanism to an end of a support arm system using mounting screws having screwheads projecting from the control mechanism and that are insertable into keyhole screw receptacles of the support arm system, the mounting screws being held temporarily in the holding slots of the screw receptacles by horizontal displacement and fixed in a holding position by rotation, the improvement comprising: a vertical lowering of the mounting screws (41) and insertion of the screwheads (42) into securing receptacles (18) at the end of the holding slots (17) of the screw receptacles (15) performed after a horizontal displacement of the mounting screws (41) to prevent the mounting screws (41) from horizontally displacing from the holding position, the screw receptacles (15) attached in a connection plate (10) which is connected to an end of the support arm system, and the connection plate (10) configured as a hood and having a rectangular connection plate (12) for the control mechanism (35), which in corner regions has four of the screw receptacles (15) oriented in a same direction.

10. In the device according to claim 9, wherein the mounting screws (41) are attached to a connection frame (40) which is connectible to the control mechanism (35), that surrounds an insertion opening (37) of the control mechanism (35), and that is fixed to an inner side of a cover wall (36) of the control mechanism (35), and the mounting screws (41) have the screwheads (42) projecting to the outer side of the cover wall (36).

11. In the device according to claim 9 wherein the connection frame (40) with the mounting screws (41) is adapted to a number and a distribution of the screw receptacles (15) in the connection plate (10).

* * * * *